(12) United States Patent
Herr

(10) Patent No.: US 12,714,170 B2
(45) Date of Patent: Aug. 25, 2026

(54) EMF RADIATION REPELLING DEVICE

(71) Applicant: Adam Herr, Park City, UT (US)

(72) Inventor: Adam Herr, Park City, UT (US)

( * ) Notice: Subject to any disclaimer, the term of this patent is extended or adjusted under 35 U.S.C. 154(b) by 79 days.

(21) Appl. No.: 18/916,007

(22) Filed: Oct. 15, 2024

(65) Prior Publication Data

US 2026/0101946 A1 Apr. 16, 2026

(51) Int. Cl.

*A41D 31/04* (2019.01)
*A41D 27/20* (2006.01)
*H05K 9/00* (2006.01)

(52) U.S. Cl.

CPC ............ *A41D 31/04* (2019.02); *A41D 27/20* (2013.01); *H05K 9/0043* (2013.01); *H05K 9/009* (2013.01); *A41D 2300/20* (2013.01)

(58) Field of Classification Search

CPC ...... A41D 27/20; A41D 1/002; A41D 27/205; A41D 13/0012; A41D 15/04; A41D 2400/42; A41D 2200/20; A41D 27/04; A41D 27/02; A41D 2400/422; A41D 15/00; A41D 15/02; H05K 9/0009; H05K 9/0043; H05K 9/0081; A41F 4/12; A45C 2007/0004; A45C 7/0095; A45C 11/002; A45C 2011/186; A45C 1/06; A45C 2001/065; A41B 15/00; A41B 15/02; A42B 1/048; A42B 1/041; A42B 1/006

See application file for complete search history.

(56) References Cited

U.S. PATENT DOCUMENTS 2,882,532 A * 4/1959 O'Donnell ............. A41D 27/20 2/253
5,073,984 A * 12/1991 Tone ......................... G21F 3/02 2/457
6,223,958 B1 * 5/2001 Kohn ....................... A45C 1/04 224/267
D483,181 S 12/2003 Evans
D681,949 S 5/2013 Kershenstein
8,718,729 B1 5/2014 Kershenstein
9,345,178 B2 5/2016 Davis (Continued)

FOREIGN PATENT DOCUMENTS

DE 202020104411 U1 * 8/2020 ............ A41D 27/20
GB 2463727 3/2010
JP 2000178801 A * 6/2000

OTHER PUBLICATIONS

Translation of DE-202020104411-U1 (Year: 2020).*
Translation of JP-2000178801-A (Year: 2000).*

*Primary Examiner* — Grady Alexander Nunnery

(57) ABSTRACT

An EMF radiation repelling device for inhibit transference of electromagnetic radiation signals to and from electronic devices includes a cloth comprising a flexible material wherein the cloth is foldable into a pouch configuration. The pouch configuration is designed to be positionable within a pocket of an article of clothing wherein the cloth is designed to line the pocket of the article of clothing while the cloth is folded in the pouch configuration and when the cloth is positioned within the pocket. The flexible material includes a conductive material with high decibel attenuation wherein the conductive material is designed to inhibit transfer of electromagnetic frequencies through the cloth. A coupler is coupled to the cloth to releasably retain the cloth in the pouch configuration.

10 Claims, 9 Drawing Sheets

(56) References Cited

U.S. PATENT DOCUMENTS

| | | | | |
|---|---|---|---|---|
| 11,871,551 | B1 | 1/2024 | Zar | |
| 2007/0034406 | A1* | 2/2007 | Schroader | H05K 9/0043 174/380 |
| 2012/0047631 | A1 | 3/2012 | Connolly | |
| 2012/0061134 | A1* | 3/2012 | Kennedy | D02G 3/12 174/388 |
| 2013/0220694 | A1 | 8/2013 | Wittman-Holloway | |
| 2018/0140063 | A1 | 5/2018 | Gomez | |

* cited by examiner 50
48
44
52
54

46
42
10
30
56
12
26
24

28

EMF RADIATION REPELLING DEVICE

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

The disclosure relates to protective liners and more particularly pertains to a new protective liner for inhibit transference of electromagnetic radiation signals to and from electronic devices.

(2) Description of Related Art Including Information Disclosed Under 37 CFR 1.97 and 1.98

The prior art relates to protective liners. Identity theft is one of the fastest-growing crimes, affecting millions of people each year. Fraudsters use many techniques to unlawfully obtain victim's personal information. As technology improves, and as people continue storing more and more of their personal data on electronic devices, the risk of identity theft continues to grow. Personal electronic devices can also emit radiation, posing health risks. Thus, there is a need for a protective liner for personal items such as cell phones and credit cards, to block the transfer of electromagnetic frequencies, preventing identity theft attempts and reducing exposure to radiation. Ideally, such a device would be removably couplable to articles of clothing, allowing the user to use the device with any outfit.

Brief Summary of the Invention

An embodiment of the disclosure meets the needs presented above by generally comprising a cloth comprising a flexible material wherein the cloth is foldable into a pouch configuration. The pouch configuration is configured to be positionable within a pocket of an article of clothing wherein the cloth is configured to line the pocket of the article of clothing while the cloth is folded in the pouch configuration and when the cloth is positioned within the pocket. The flexible material includes a conductive material with high decibel attenuation wherein the conductive material is configured to inhibit transfer of electromagnetic frequencies through the cloth. A coupler is coupled to the cloth to releasably retain the cloth in the pouch configuration.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figures 1, 2:
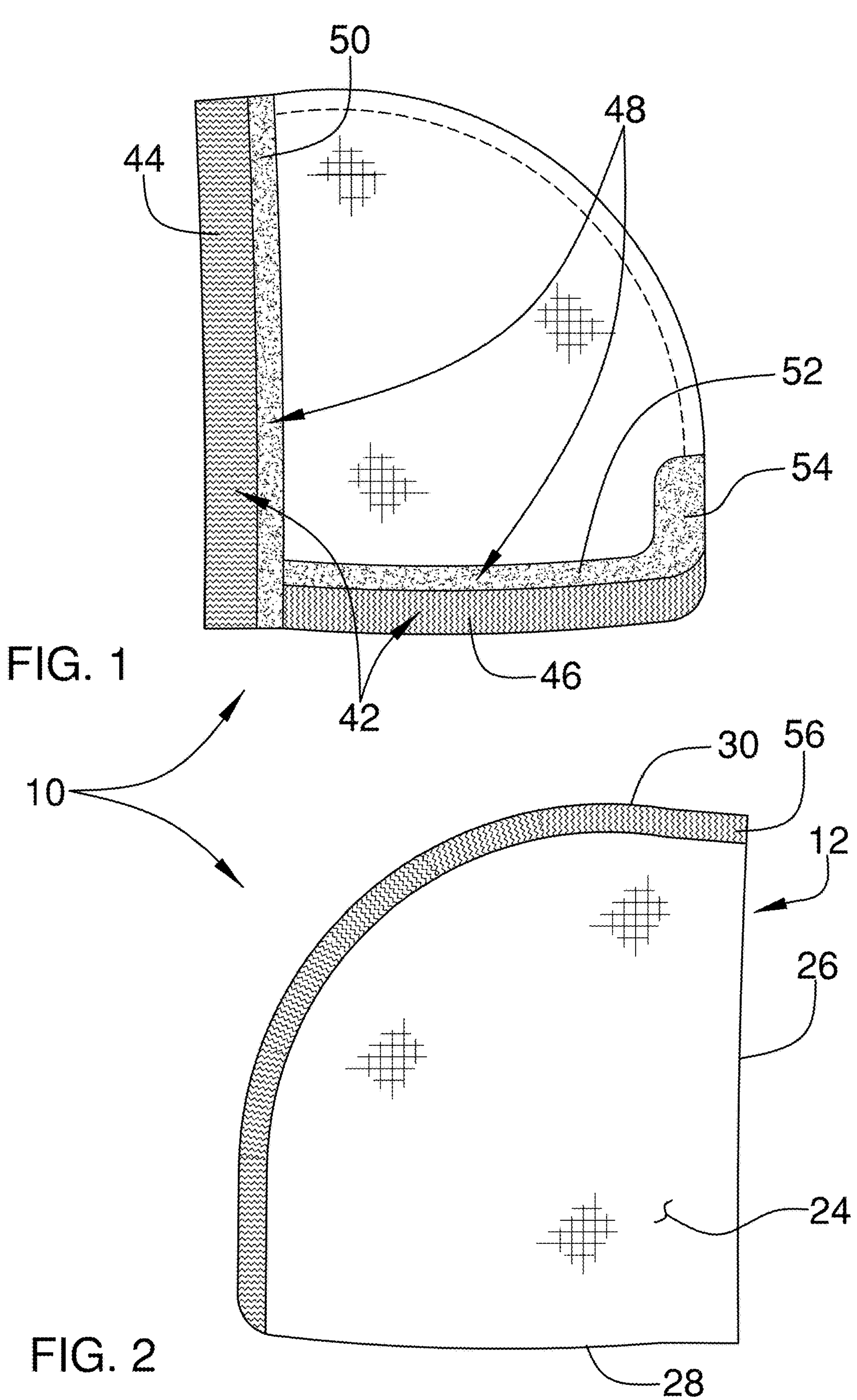
FIG. 1 is a top view of an EMF radiation repelling device according to an embodiment of the disclosure.
FIG. 2 is a bottom view of an embodiment of the disclosure.
Figures 3, 4:
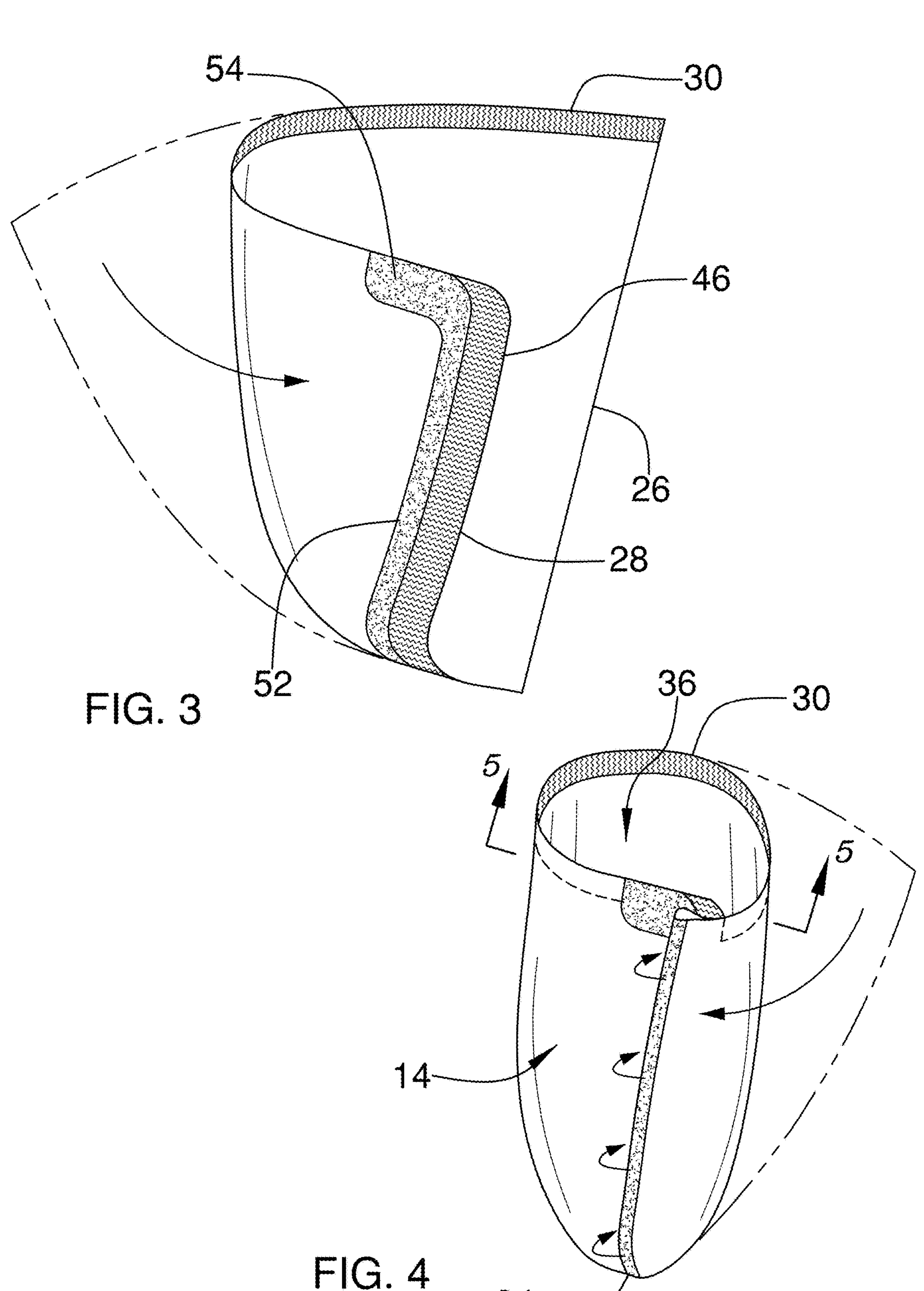
FIG. 3 is an in-use view of an embodiment of the disclosure.
FIG. 4 is an in-use view of an embodiment of the disclosure.
Figure 5:
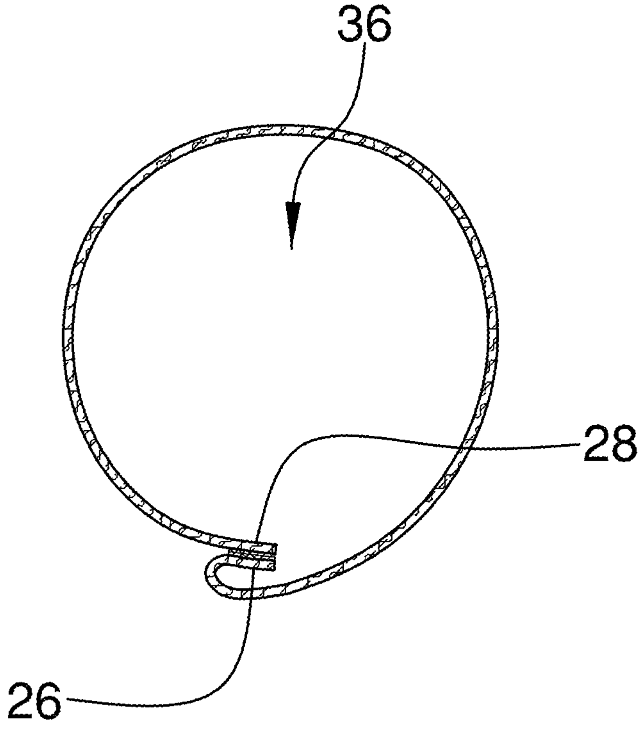
FIG. 5 is a top view of an embodiment of the disclosure.
Figure 6:
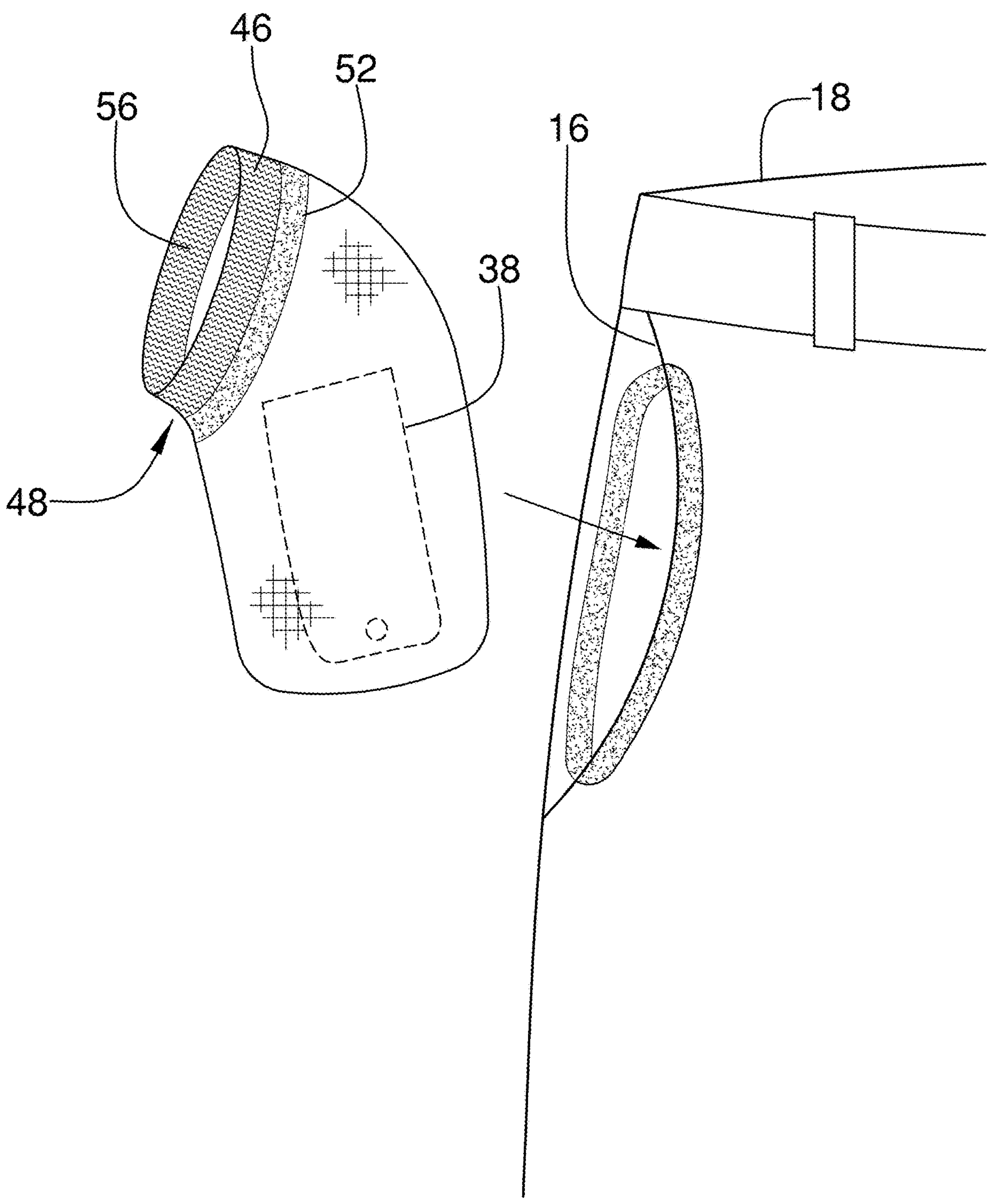
FIG. 6 is an in-use view of an embodiment of the disclosure.

With reference now to the drawings, and in particular to FIGS. 1 through 11 thereof, a new protective liner embodying the principles and concepts of an embodiment of the disclosure and generally designated by the reference numeral 10 will be described.

As best illustrated in FIGS. 1 through 11, the EMF radiation repelling device 10 generally comprises a cloth 12, which generally comprises a flexible material wherein the cloth 12 is foldable into a pouch configuration 14. The pouch configuration 14 is generally configured to be positionable within a pocket 16 of an article of clothing 18. The cloth 12 may be configured to line the pocket 16 of the article of clothing 18 while the cloth 12 is folded in the pouch configuration 14 and when the cloth 12 is positioned within the pocket 16. In the exemplary embodiments provided in the figures, the article of clothing 18 may be a pair of pants or a sweatshirt. Accordingly, exemplary embodiments of the pocket 16 include the front or back pockets of the pair of pants, or the belly pocket of the sweatshirt.

The cloth 12 may be planar when the cloth 12 is unfolded from the pouch configuration 14. For example, the cloth 12 may be configured to be positionable to line a hood 20 of the article of clothing 18 while the cloth 12 is unfolded from the pouch configuration 14 and when the cloth 12 is positioned within the hood 20.

The flexible material may include a conductive material that has high decibel attenuation wherein the conductive material is configured to inhibit transfer of electromagnetic frequencies through the cloth 12. For example, the conductive material may include a silver-fiber fabric. The conductive material is generally configured to block out electromagnetic frequencies that range from low frequency, for example around 600 megahertz, to high frequency, for example around 40 gigahertz. More specifically, the conductive material may be configured to block out electromagnetic frequencies from wireless networks, including second generation wireless cellular technologies (also known as "2G" signals, such as the global system for mobile communications, or GSM signal) through fifth generation wireless cellular technologies (also known as "5G" signals).

The cloth 12 may have a top side 22 and a bottom side 24. The cloth 12 may also have a first edge 26, a second edge 28, and a third edge 30. The first edge 26 may be perpendicular to the second edge 28. The third edge 30 may be convexly arcuate between the first edge 26 and the second edge 28. The first edge 26 may have a length exceeding a length of the second edge 28. The third edge 30 may have a length exceeding a length of the first edge 26. For example, the first edge 26 may have a length between 14.0 inches and 18.0 inches, the second edge 28 having a length between 12.0 inches and 16.0 inches, and the third edge 30 having a length between 17.0 inches and 21.0 inches.

The cloth 12 may define a cone shape 32 that has a vertex 34 distally positioned relative to an opening 36 while the cloth 12 is in the pouch configuration 14. The opening 36 may be defined by the third edge 30 of the cloth 12. The vertex 34 may be defined by an intersection between the first edge 26 and the second edge 28. The opening 36 is generally configured to receive a personal item 38 wherein the pouch configuration 14 is configured to store the personal item 38 and wherein the conductive material of the cloth 12 is configured to inhibit transfer of electromagnetic frequencies through the cloth 12 to the personal item 38 while the personal item 38 is stored within the pouch configuration 14 of the cloth 12.

Figure 7:
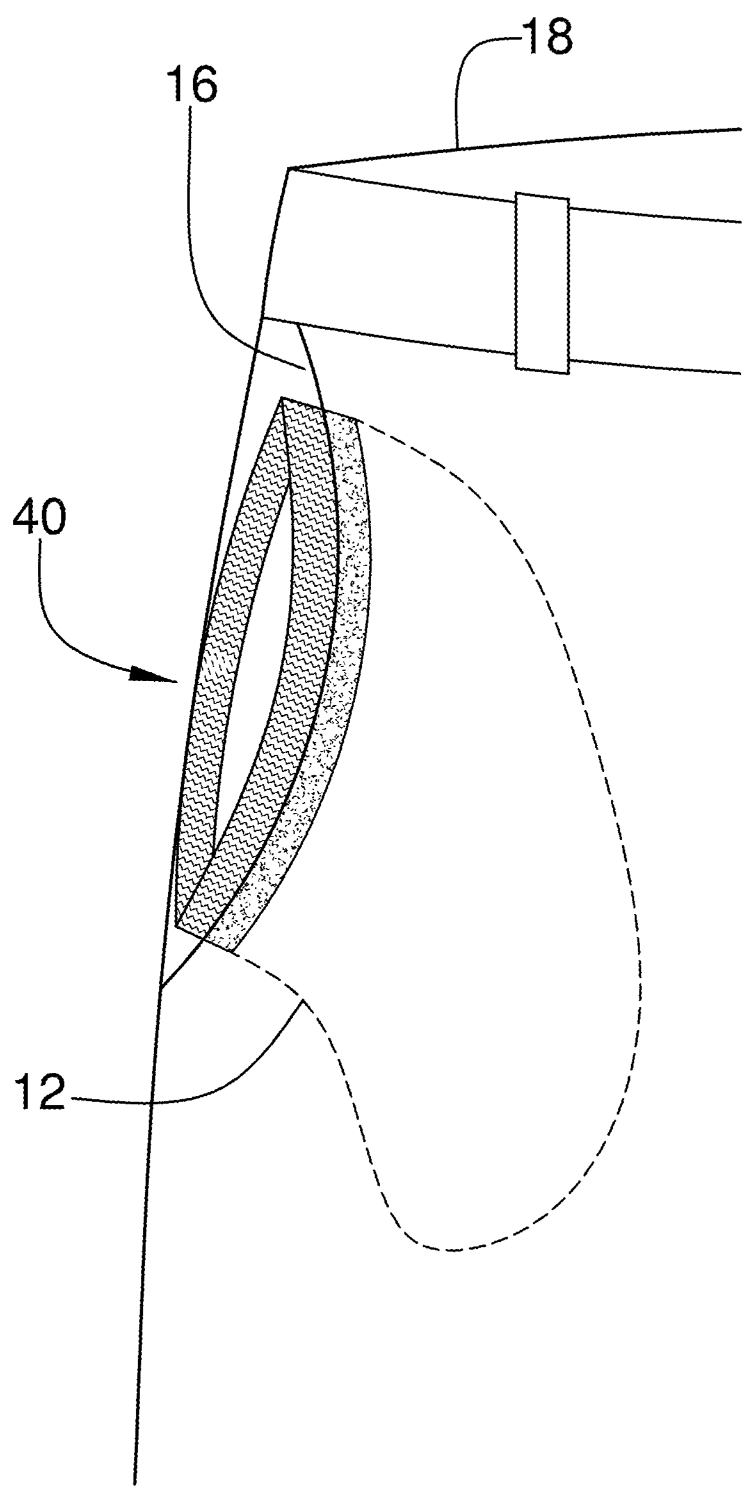
FIG. 7 is an in-use view of an embodiment of the disclosure.
Figure 8:
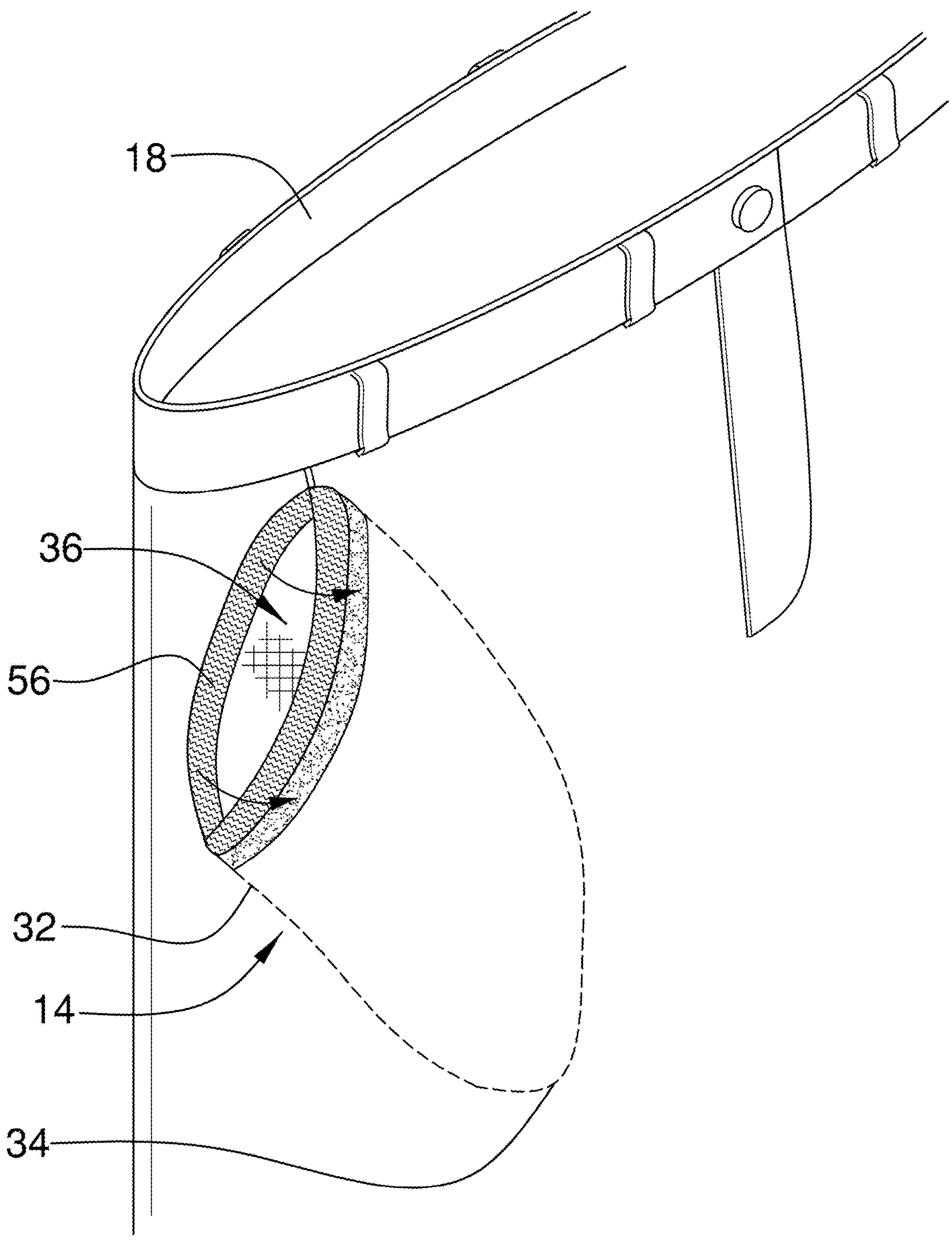
FIG. 8 is an in-use view of an embodiment of the disclosure.
Figure 9:
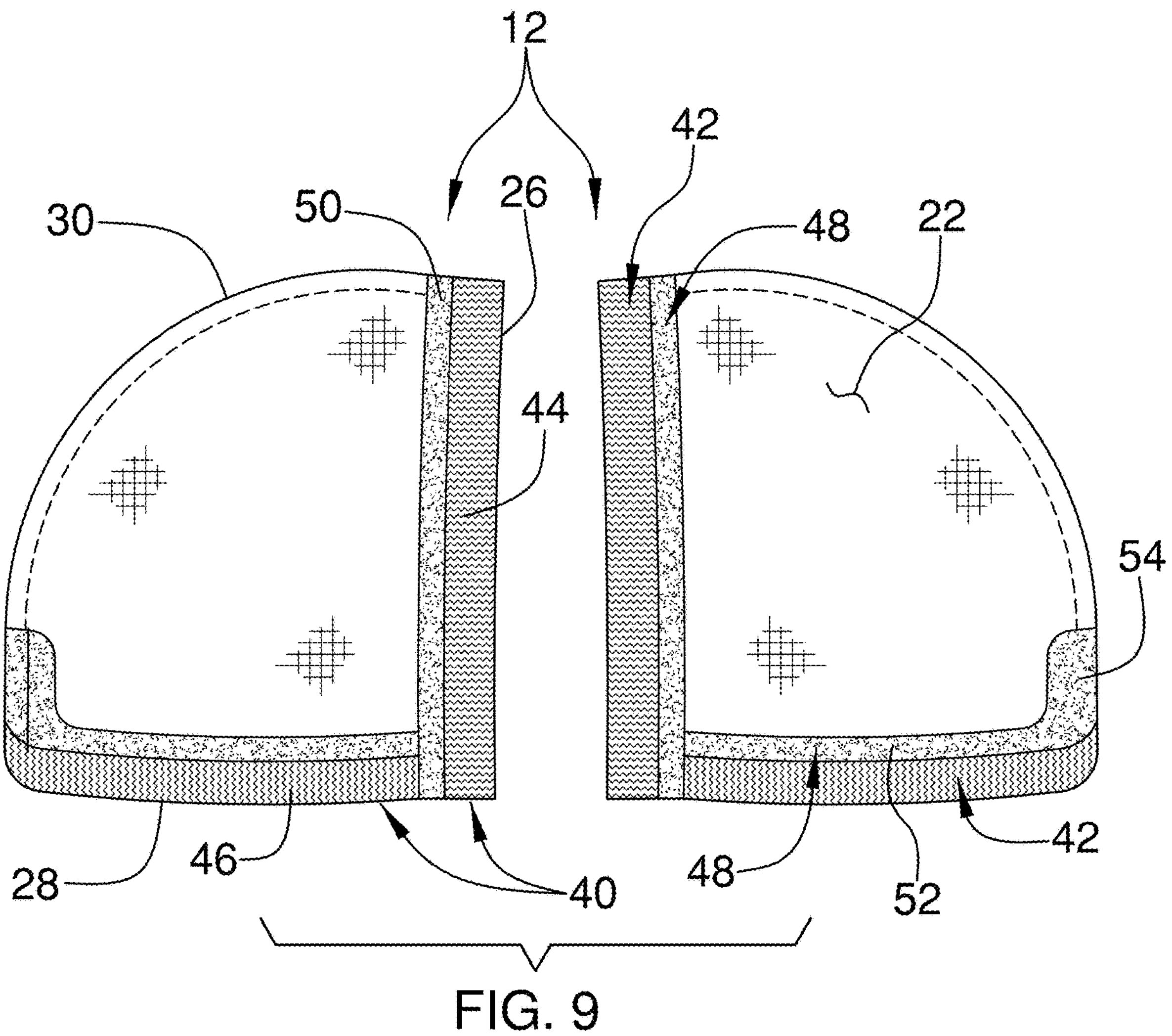
FIG. 9 is a top view of an embodiment of the disclosure.
Figure 10:
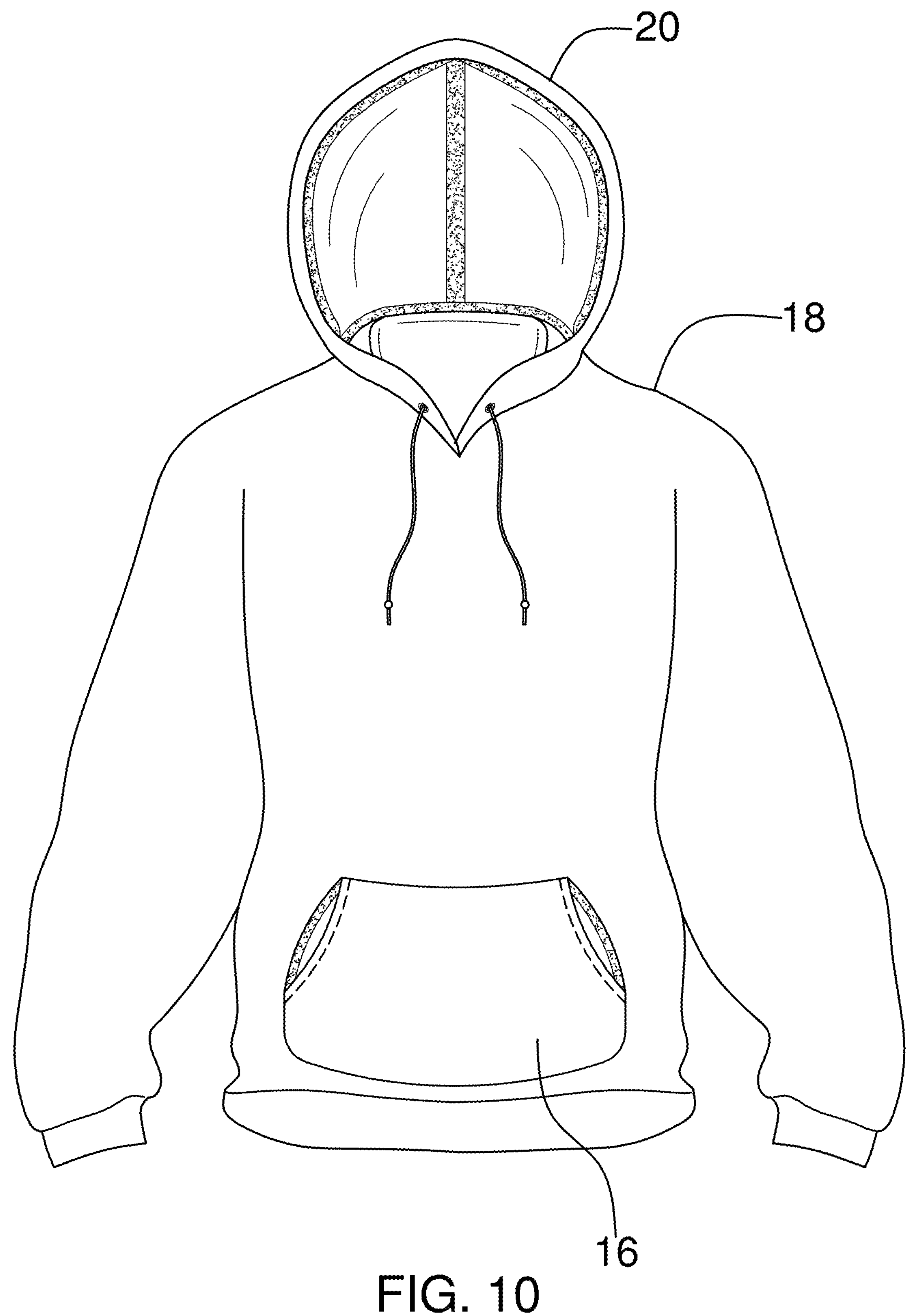
FIG. 10 is a front view of an embodiment of the disclosure.
Figure 11:
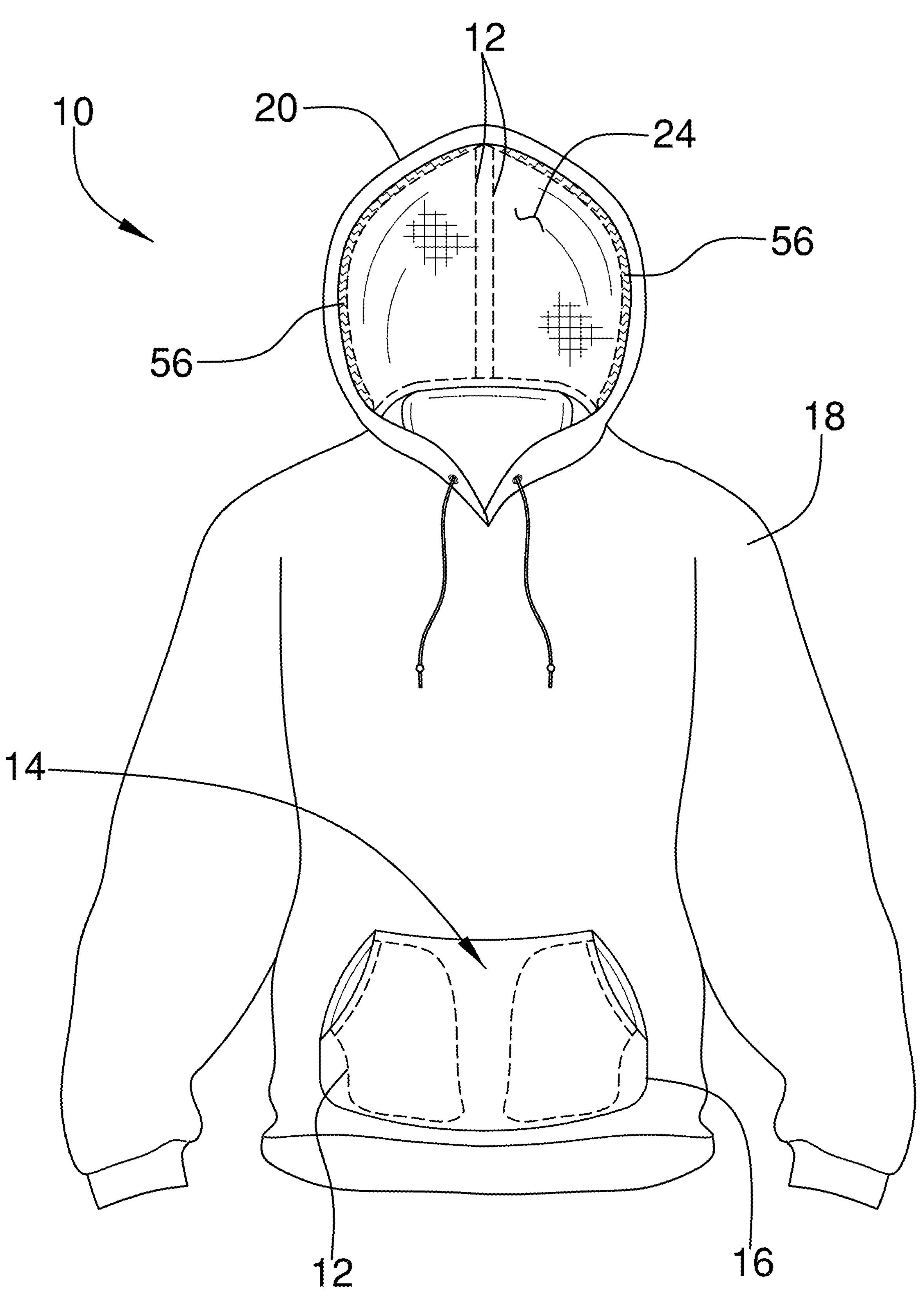
FIG. 11 is an in-use view of an embodiment of the disclosure.

For example, the personal item 38 may be a cellular telephone, as shown in FIG. 7, a credit card, or another device which stores personal information that is electronically readable. The conductive material may be configured to inhibit electromagnetic frequencies to and from the personal item 38 to inhibit the personal information from being accessed without authorization. Because the conductive material of the cloth 12 can inhibit transfer of electromagnetic frequencies, the conductive material can also provide protection for a user against radiation emitted by the personal item 38 (e.g., when the personal item 38 is a cellular telephone), while also protecting data and privacy of the user by blocking incoming signals used for things like RFID skimming and FOB skimming.

A coupler 40 is coupled to the cloth 12 to releasably retain the cloth 12 in the pouch configuration 14. For example, the coupler 40 may include a first coupling member 42 that is generally attached to the top side 22 of the cloth 12. The first coupling member 42 may be a hook material. The first coupling member 42 may include a primary piece 44, which is generally positioned adjacent to the first edge 26 of the cloth 12. The primary piece 44 may have a length that is equal to a length of the first edge 26 of the cloth 12. A secondary piece 46 may be positioned adjacent to the second edge 28 of the cloth 12. The secondary piece 46 may have a length that is less than a length of the second edge 28 of the cloth 12.

A second coupling member 48 may be attached to the top side 22 of the cloth 12. The second coupling member 48 is removably engageable with the first coupling member 42. For example, the second coupling member 48 may be a loop material. The first coupling member 42 may have a width that exceeds a width of the first coupling member 42. For example, the width of the first coupling member 42 may be twice the width of the second coupling member 48.

The second coupling member 48 may include a first portion 50 that is positioned proximate to the first edge 26 of the cloth 12. The primary piece 44 of the first coupling member 42 may be positioned between the first edge 26 of the cloth 12 and the first portion 50 of the second coupling member 48. The first portion 50 may have a length that is equal to a length of the first edge 26 of the cloth 12. The first portion 50 may releasably engage the secondary piece 46 of the first coupling member 42 to releasably retain the cloth 12 in the pouch configuration 14.

A second portion 52 of the second coupling member 48 may be positioned proximate to the second edge 28 of the cloth 12. For example, the secondary piece 46 of the first coupling member 42 may be positioned between the second edge 28 of the cloth 12 and the second portion 52 of the second coupling member 48. The second portion 52 may have a length that is less than a length of the second edge 28 of the cloth 12. The second portion 52 may releasably engage the primary piece 44 of the first coupling member 42 to releasably retain the cloth 12 in the pouch configuration 14.

A third portion 54 of the second coupling member 48 may extend upwardly from the second portion 52. For example, the third portion 54 may be positioned to extend along the third edge 30 of the cloth 12. The third portion 54 may have a length that is less than a length of the third edge 30 of the cloth 12. For example, the third portion 54 may have a length that is between 2.0 inches and 3.0 inches.

A third coupling member 56 may be attached to the bottom side 24 of the cloth 12. The third coupling member 56 may be removably engageable with the second coupling member 48. For example, the third coupling member 56 may be a hook material. The third coupling member 56 may be positioned adjacent to the third edge 30 of the cloth 12. The third coupling member 56 may have a length that is equal to a length of the third edge 30 of the cloth 12.

The third edge 30 of the cloth 12 may be pivotable to cover the opening 36 when the cloth 12 is in the pouch configuration 14. In such embodiments, the third coupling member 56 may be engageable with the third portion 54 of the second coupling member 48 to releasably retain the third edge 30 of the cloth 12 over the opening 36. The third coupling member 56 may also be engageable with the second portion 52 of the second coupling member 48 to secure the third edge 30 over the opening 36.

In use, the cloth 12 can be used to block radiation whether the cloth 12 is folded into the pouch configuration 14 or unfolded from the pouch configuration 14. For example, as explained above, the article of clothing 18 may be a pair of pants or a hooded sweatshirt. When the cloth 12 is folded into the pouch configuration 14, the cloth 12 can be positioned within the pocket 16 to line the pocket 16. For example, the pocket 16 may include a hook and loop material that is releasably engageable with the coupler. In such embodiments, the third edge 30 of the cloth 12 may also be folded over the opening 36 of the of the pouch configuration 14, to inhibit the personal item 38 from falling out of the pocket 16. Of course, the cloth 12 may be used to protect the personal item 38 from electromagnetic frequency radiation even when the cloth 12 is not being used to line the pocket 16 of the article of clothing 18. Alternatively, when the cloth 12 is unfolded from the pouch configuration 14, the cloth 12 can be positioned to line a hood 20 of the article of clothing, for example to protect the user from radiation.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A protective liner assembly comprising:

a cloth comprising a flexible material wherein the cloth is foldable into a pouch configuration, the pouch configuration being configured to be positionable within a pocket of an article of clothing wherein the cloth is configured to line the pocket of the article of clothing while the cloth is folded in the pouch configuration and when the cloth is positioned within the pocket, the flexible material including a conductive material being a silver-fiber fabric wherein the conductive material is configured to inhibit transfer of electromagnetic frequencies through the cloth, the cloth having a first edge, a second edge, and a third edge, the cloth having a top side and a bottom side;

the cloth defining a cone shape having a vertex being distally positioned relative to an opening while the cloth is in the pouch configuration, the opening being defined by the third edge of the cloth, the vertex being defined by an intersection between the first edge and the second edge, the opening being configured to receive a personal item wherein the pouch configuration is configured to store the personal item and wherein the conductive material of the cloth is configured to inhibit transfer of electromagnetic frequencies through the cloth to the personal item while the personal item is stored within the pouch configuration of the cloth; and a coupler being coupled to the cloth to releasably retain the cloth in the pouch configuration, the coupler including:

a first coupling member; and a second coupling member being removably engageable with the first coupling member, the second coupling member including:

a first portion being positioned proximate to the first edge of the cloth; and a second portion being positioned proximate to the second edge of the cloth, the third edge of the cloth being convexly arcuate between the first portion and the second portion.

2. The protective liner assembly of claim 1, wherein the first edge is perpendicular to the second edge.

3. The protective liner assembly of claim 1, wherein the first edge has a length exceeding a length of the second edge and wherein the third edge has a length exceeding a length of the first edge.

4. The protective liner assembly of claim 1, wherein the third edge of the cloth is pivotable to cover the opening when the cloth is in the pouch configuration.

5. The protective liner assembly of claim 1, the coupler further comprising:

a third coupling member being attached to the bottom side of the cloth, the third coupling member being removably engageable with the second coupling member.

6. The protective liner assembly of claim 5, wherein the third coupling member is positioned adjacent to the third edge of the cloth.

7. The protective liner assembly of claim 1, the first coupling member further comprising:

a primary piece being positioned adjacent to the first edge of the cloth; and a secondary piece being positioned adjacent to the second edge of the cloth.

8. The protective liner assembly of claim 7, wherein the primary piece of the first coupling member is positioned between the first edge of the cloth and the first portion of the second coupling member, the first portion of the second coupling member releasably engaging the secondary piece of the first coupling member to releasably retain the cloth in the pouch configuration; and the secondary piece of the first coupling member is positioned between the second edge of the cloth and the second portion of the second coupling member, the second portion releasably engaging the primary piece of the first coupling member to releasably retain the cloth in the pouch configuration.

9. The protective liner assembly of claim 8, the second coupling member further comprising a third portion extending upwardly from the second portion wherein the third portion is positioned to extend along the third edge of the cloth.

10. A protective liner assembly comprising:

a cloth comprising a flexible material wherein the cloth is foldable into a pouch configuration, the pouch configuration being configured to be positionable within a pocket of an article of clothing wherein the cloth is configured to line the pocket of the article of clothing while the cloth is folded in the pouch configuration and when the cloth is positioned within the pocket, the cloth being planar when the cloth is unfolded from the pouch configuration wherein the cloth is configured to be positionable to line a hood of the article of clothing while the cloth is unfolded from the pouch configuration and when the cloth is positioned within the hood, the flexible material including a conductive material being a silver-fiber fabric wherein the conductive material is configured to inhibit transfer of electromagnetic frequencies through the cloth, the cloth having a top side and a bottom side, the cloth having a first edge, a second edge, and a third edge, the first edge being perpendicular to the second edge, the third edge being convexly arcuate between the first edge and the second edge, the first edge having a length exceeding a length of the second edge, the third edge having a length exceeding a length of the first edge;

the cloth defining a cone shape having a vertex being distally positioned relative to an opening while the cloth is in the pouch configuration, the opening being defined by the third edge of the cloth, the vertex being defined by an intersection between the first edge and the second edge, the opening being configured to receive a personal item wherein the pouch configuration is configured to store the personal item and wherein the conductive material of the cloth is configured to inhibit transfer of electromagnetic frequencies through the cloth to the personal item while the personal item is stored within the pouch configuration of the cloth;

a coupler being coupled to the cloth to releasably retain the cloth in the pouch configuration, the coupler including:

a first coupling member being attached to the top side of the cloth, the first coupling member being a hook material, the first coupling member including:

a primary piece being positioned adjacent to the first edge of the cloth, the primary piece having a length being equal to a length of the first edge of the cloth;

a secondary piece being positioned adjacent to the second edge of the cloth, the secondary piece having a length being less than a length of the second edge of the cloth;

a second coupling member being attached to the top side of the cloth, the second coupling member being removably engageable with the first coupling member, the first coupling member having a width exceeding a width of the first coupling member, the second coupling member being a loop material, the second coupling member including:

a first portion being positioned proximate to the first edge of the cloth wherein the primary piece of the first coupling member is positioned between the first edge of the cloth and the first portion of the second coupling member, the first portion having a length being equal to a length of the first edge of the cloth, the first portion releasably engaging the secondary piece of the first coupling member to releasably retain the cloth in the pouch configuration;

a second portion being positioned proximate to the second edge of the cloth wherein the secondary piece of the first coupling member is positioned between the second edge of the cloth and the second portion of the second coupling member, the second portion having a length being less than a length of the second edge of the cloth, the second portion releasably engaging the primary piece of the first coupling member to releasably retain the cloth in the pouch configuration;

a third portion extending upwardly from the second portion wherein the third portion is positioned to extend along the third edge of the cloth, the third portion having a length being less than a length of the third edge of the cloth wherein the third portion has a length being between 2.0 inches and 3.0 inches; and a third coupling member being attached to the bottom side of the cloth, the third coupling member being removably engageable with the second coupling member, the third coupling member being positioned adjacent to the third edge of the cloth, the third coupling member having a length being equal to a length of the third edge of the cloth, the third coupling member being a hook material, the third edge of the cloth being pivotable to cover the opening when the cloth is in the pouch configuration, the third coupling member being engageable with the third portion of the second coupling member to releasably retain the third edge of the cloth over the opening.

* * * * *